United States Patent [19]

Daems et al.

[11] Patent Number: 5,681,683
[45] Date of Patent: Oct. 28, 1997

[54] IMAGING ELEMENT COMPRISING A PHOTOPOLYMERIZABLE COMPOSITION

[75] Inventors: Eddie Daems, Herentals; Joan Vermeersch, Deinze; Marc Van Damme, Heverlee; Luc Leenders, Herentals; Thomas Nouwen, Meeuwen; Hendrik Kokelenberg, Schoten, all of Belgium

[73] Assignee: Agfa-Gevaert, N.V., Mortsel, Belgium

[21] Appl. No.: 561,748

[22] Filed: Nov. 22, 1995

Related U.S. Application Data

[62] Division of Ser. No. 339,700, Nov. 14, 1994, abandoned.

[30] Foreign Application Priority Data

Nov. 16, 1993 [EP] European Pat. Off. ............ 93203187

[51] Int. Cl.$^6$ ........................................... G03C 1/76
[52] U.S. Cl. ................. 430/263; 430/271.1; 430/273.1; 430/278.1; 430/259; 430/253; 430/254
[58] Field of Search ............................ 430/259, 278.1, 430/271.1, 273.1, 253, 254, 263

[56] References Cited

FOREIGN PATENT DOCUMENTS

| | | |
|---|---|---|
| 1530410 | 11/1978 | European Pat. Off. . |
| 0410500 | 1/1991 | European Pat. Off. . |
| 0483415 | 5/1992 | European Pat. Off. . |
| 0568744 | 11/1993 | European Pat. Off. . |
| 2080616 | 11/1971 | France . |

*Primary Examiner*—George F. Lesmes
*Assistant Examiner*—Cheryl Juska
*Attorney, Agent, or Firm*—Breiner & Breiner

[57] ABSTRACT

The present invention provides an imaging element comprising on a hydrophilic base a hydrophobic photopolymerizable composition capable of being irradiated with actinic light through the support and/or through the front and containing a photopolymerizable composition characterized in that a water-swellable barrier layer comprising at least one non-proteinic water-soluble film-forming polymer is located between said hydrophilic base and said hydrophobic photopolymerizable composition, contiguous to the hydrophilic base and is coated at a ratio of 0.01 to 2.0 g/m2, said water-swellable barrier layer being capable of being peeled off of said hydrophilic base by dry development.

5 Claims, No Drawings

IMAGING ELEMENT COMPRISING A PHOTOPOLYMERIZABLE COMPOSITION

This is a division of application Ser. No. 08/339,700 filed Nov. 14, 1994, now abandoned.

FIELD OF THE INVENTION

The present invention relates to an imaging element comprising a photopolymerizable composition and to a method for the formation of lithographic printing plates from said imaging element.

BACKGROUND OF THE INVENTION

The use of photosensitive imaging elements comprising photopolymerizable compositions for the production of images by information-wise exposure thereof to actinic radiation is well known. Several methods for forming images using photopolymerizable compositions are known. All these methods are based on the principle of introducing a differentiation in properties between the exposed and non-exposed parts of the photopolymerizable composition e.g. a difference in solubility, adhesion, conductivity, refractive index, tackiness, permeability, diffusibility of incorporated substances e.g. dyes etc. The thus produced differences may be subsequently employed in a developing step to produce a visible image and/or master for printing e.g. a lithographic or electrostatic printing master.

A difference in solubility between the exposed and non-exposed parts of the photopolymerizable composition is often used for the production of lithographic printing plates where a hydrophilic base is coated with the photopolymerizable composition, subsequently exposed and developed using a solvent to remove the non-exposed or insufficiently exposed parts. Such a process is for example described in "Unconventional imaging processes" by E. Brinckman, G. Delzenne, A. Poot and J. Willems, Focal Press London-New York, first edition 1978, pages 33 to 39. An analogous process is described in FR-P 2,080,616 wherein however a swellable hydrophilic layer is comprised between the support and the photopolymerizable composition.

The use of the difference in tackiness to obtain an image is described in e.g. U.S. Pat. No. 3,060,024, 3,085,488 and 3,649,268. According to the method disclosed in these US patents the image-wise exposed photopolymerizable composition looses its tackiness in the exposed parts while the non-exposed parts keep their tackiness. The non-exposed parts can therefore be colored with dry dye pigments to make the image visible.

According to a method disclosed in U.S. Pat. No. 3,060,023 the adhesion of the photopolymerizable composition is modified upon image-wise exposure. After image-wise exposure the non-exposed parts will stick or adhere, during a step of overall heating, to a receptor sheet thus allowing the transfer of the non-exposed parts to the receptor sheet.

U.S. Pat. No. 3,342,593 discloses a process for image production which comprises (i) exposing a photopolymerizable element having a stick temperature above 40° C. and below 220° C. imagewise, said photopolymerizable element having a support bearing a photopolymerizable layer comprising (1) a compound containing at least one terminal ethylenic group, (2) an initiator, (ii) pre-heating said exposed element to a temperature above 35° C. but below the stick temperature of the underexposed areas, (iii) heating said exposed element to a temperature above said stick temperature and (iv) transferring the unexposed polymer to a receptor.

U.S. Pat. No. 3,622,320 discloses imaging elements containing photocrosslinkable polyesters for use in heat transfer processes for making images or for making a lithographic printing plate.

GB-P 1,530,410 discloses a light-sensitive planographic printing plate material comprising (a) a support the surface of which is anodically oxidized aluminium or aluminium alloy, (b) a layer consisting of a hydrophillic organic polymer, (c) at least one layer of a light-sensitive composition and (d) a transparent cover film, arranged on said oxidized surface of the support in this order, the light-sensitive composition having the property that after the material has been imagewise exposed to light there is a difference in the adhesivity to polymer layer (b) and said transparent cover film between exposed areas and unexposed areas of said light-sensitive composition (c), the areas of greater adhesivity to said transparent cover film of said light-sensitive composition layer are peeled off together with said transparent cover film and the areas of greater adhesivity to said polymer layer (b) are left thereon, whereby an image is formed supported on the support.

EP-A 40,424 discloses a negative-working dry peel apart photopolymerizable element consisting essentially of a support, a cover sheet and therebetween a layer of photopolymerizable composition consisting essentially of (1) at least two halogen-free polymeric organic binders, (2) an initiator system, and (3) a monomer having at least one terminal ethylenic group, the monomer being present in a quantity in excess of the absorptive capacity of the binders for the monomer so that a thin layer of substantially free monomer is present at the interface between the photopolymerizable layer and the cover sheet, the adhesion of the polymerizable layer to the cover sheet being greater before polymerization than it is to the support.

EP-A 568,744 discloses a method for producing a lithographic printing plate which comprises: (i) providing an uncoated lithographic substrate, (ii) coating a photosensitive layer on one side of the lithographic substrate, (iii) providing a flexible substrate, (iv) coating an adhesive layer directly on the flexible substrate, (v) laminating the coated lithographic substrate to the coated flexible substrate, (vi) imagewise exposing the laminated element of (v) to radiation to which the photosensitive layer is sensitive and (vii) peeling off the flexible substrate along with the nonimage areas of the photosensitive layer.

Photosensitive imaging elements comprising photopolymerizable compositions can be used for the production of lithographic plates when information-wise exposure to actinic radiation and if necessary development of said photosensitive imaging elements will result in an image-wise differentiation between hydrophilic and hydrophobic parts that can be used to print with an oily or greasy ink. The hydrophobic parts will be capable of accepting lithographic ink, whereas the hydrophilic areas, when moistened with water, will not accept the ink.

As illustrated above photopolymerization can be used in a variety of methods to produce lithographic printing plates. Among these methods several are using dry-developing steps for producing lithographic printing plates which is convenient and-offers an ecological advantage. However the quality of the copies obtainable with such lithographic printing plates using a dry-developing step, e.g. a thermal transfer step, is rather low due to staining (ink acceptance in the non-printing areas). Furthermore an effective pattern-wise removal by transfer of the photosensitive layer upon heating to the receptor sheet during the development of the image requires the use of a high quality, costly receptor layer, e.g. polyester film or smooth paper. The possibility of using cheaper receptor layers e.g. coarse paper, to remove pattern-wise areas of the photopolymerizable composition would be appreciated.

SUMMARY OF THE INVENTION

It is an object of the present invention to provide an imaging element comprising a photopolymerizable composition said imaging element being developable after exposure using heat and/or pressure and providing a lithographic printing plate of a high quality upon pattern-wise removal of said photopolymerizable composition by means of a receptor element, even when applying cheap receptor layers.

It is another object of the present invention to provide a method for obtaining a lithographic printing plate of a high quality using said imaging element.

Further objects of the present invention will become clear from the description hereinafter.

According to the present invention an imaging element is provided comprising on a hydrophilic base a hydrophobic photopolymerizable composition capable of being irradiated with actinic light through the support and/or through the front, and comprising at least one monomer and at least one polymeric bender characterized in that a water-swellable barrier layer comprising at least one non-proteinic water-soluble film-forming polymer is located between said hydrophilic base and said hydrophobic photopolymerizable composition, contiguous to the hydrophilic base and is coated at a ratio of 0.01 to 2.0 g/m2, said water-swellable barrier layer being capable of being peeled off of said hydrophilic base by dry development.

According to the present invention there is also provided a method for obtaining a lithographic printing plate comprising the steps of:
(a) image-wise or information-wise exposing an imaging element according to the present invention
(b) laminating said imaging element with its upper non-receptor layer to a receptor layer of a receptor element before or after said exposure and
(c) peeling away the receptor element from the hydrophilic base thus transferring said hydrophobic photopolymerizable composition pattern-wise to the receptor element.

DETAILED DESCRIPTION OF THE INVENTION

It has been found that lithographic printing plates of high quality can be obtained according to the method of the present invention using an imaging element comprising on a hydrophilic base a hydrophobic photopolymerizable composition and a water-swellable barrier layer located between said support and said hydrophobic photopolymerizable composition. More precisely it has been found that said lithographic printing plates give copies which are substantially free of staining. When the water-swellable barrier layer used in the imaging element according to the present invention is left out the obtained lithographic printing plates produce copies which show considerably more staining.

The hydrophilic-base may be a hardened hydrophilic layer, containing a hydrophilic binder coated on a flexible hydrophobic support or it may be a hydrophilic metallic support e.g. an aluminum support.

Such hydrophilic binders are disclosed in e.g. EP-A 450,199. Preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419, 512, FR-P 2,300,354, U.S. Pat. No. 3,971,660, U.S. Pat. No. 4,284,705, EP-A 405,016 and EP-A 450,199 which therefor are incorporated herein by reference.

One or more subbing layers may be coated between said flexible hydrophobic support and said hydrophilic layer. A preferred subbing layer for use in connection with the present invention, is a subbing layer contiguous to the hydrophilic layer characterized in that said subbing layer contains gelatin and silica.

More preferably an aluminum support is used.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but my still improve the printing results. Preferably the aluminum foil has a roughness with a CLA value between 0.2 and 1.5 µm, an anodization layer with a thickness between 0.4 and 2.0 µm and is sealed with an aqueous bicarbonate solution.

According to the present invention the toughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like HCl, $HNO_3$, $H_2SO_2$, $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates, $H_2O_2$, etc.

Electrochemical graining in connection with the present invention can be performed using single-phase and three-phase alternating current. The voltage applied to the aluminum plate is preferably 10–35 V. A current density of 3–150 Amp/$dm^2$ is employed for 5–240 seconds. The temperature of the electrolytic graining solution my vary from 5°–50° C. Electrochemical graining is carried out preferably with an alternating current from 10 Hz to 300 Hz.

The toughening is preferably preceded by a degreasing treatment mainly for removing fetty substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After roughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 A/dm$^2$ and a voltage within the range 1–100 V to obtain an anodized film weight of 1–8 g/m$^2$ Al$_2$O$_3$.H$_2$O. The anodized aluminum foil may subsequently be rinsed with demineralised water within a temperature range of 10°–80° C.

After the anodizing step sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

Preferably, said sealing is performed by treating a grained and anodized aluminum Support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-Pu-58-14,797.

According to the present invention the imaging element comprises on the hydrophilic base a hydrophobic photopolymerizable composition comprising at least one monomer and at least one polymeric binder.

The photopolymerizable composition in accordance with the present invention can contain a monomer containing at least one polymerizable ethylenically unsaturated group. Monomers containing at least two polymerizable ethylenically unsaturated groups are preferably used. Particularly preferred are urethane type monomers, such as the compounds of table I and those disclosed in EP-A 502562 and unsaturated esters of polyols, especially esters of polyols and an alpha-methylene carboxylic acid.

Examples of urethane type monomers are given in table I.

TABLE I

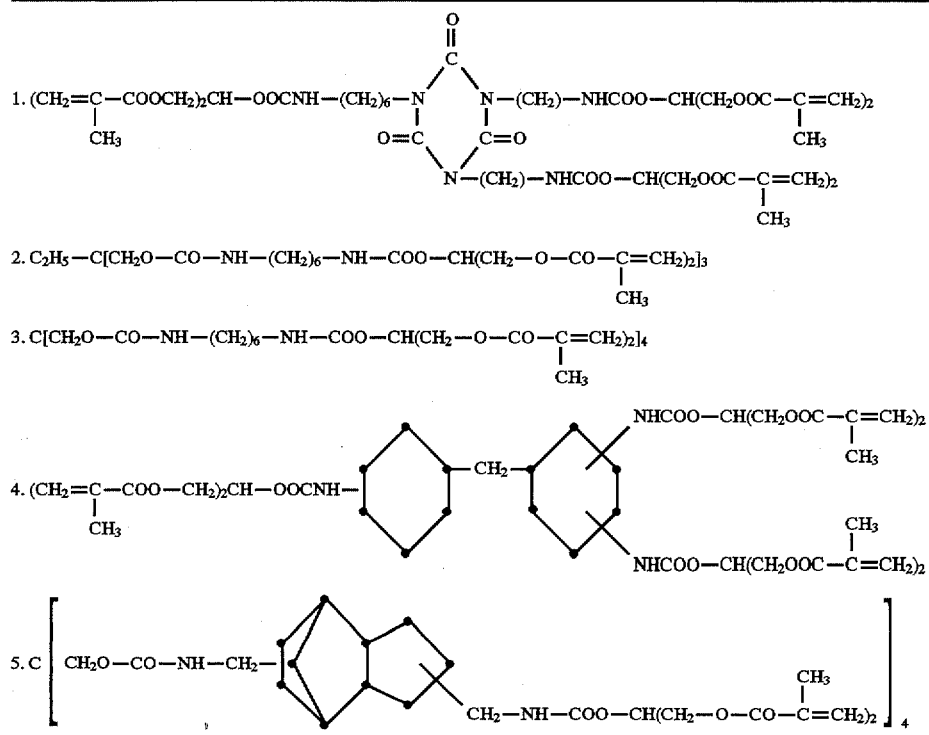

Examples of esters of a polyol and an alpha-methylene carboxylic acid are: ethylene diacrylate, glycerol tri(meth) acrylate, ethylene dimethacrylate, 1,3-propanediol di(meth) acrylate, 1,2,4-butanetriol tri(meth)acrylate, 1,4-cyclohexanediol di(meth)acrylate, 1,4-benzenediol di(meth) acrylate, pentaerythritol tetra(meth)acrylate, dipentaerythritol pentaacrylate, 1,5-pentanediol di(meth)

acrylate, the bis acrylates and methacrylates of polyethylene glycols of molecular weight 200–500, and the like.

Other types of monomers suitable for use in the photopolymerizable composition in accordance with the present invention are e.g. the monomers disclosed in EP-A 502562, DEOS no. 4,109,239, 4,005,231, 3,643,216, 3,625,203, 3,516,257, 3,516,256 and 3,632,657, which therefor are incorporated herein by reference. Further types of monomers suitable for use in the photopolymerizable composition in accordance with the present invention are disclosed in EP-A 522,616. It will be clear that these monomers and/or polymers and/or oligomers can be used in admixture.

The photopolymerizable composition used in accordance with the present invention preferably also comprises at least one photoinitiator, wich can be a single compound or a composition. Preferably used photoinitiators are polymerization initiators activatable by actinic light and inactive at and below the storing conditions of the photosensitive material. Examples of such a initiators are disclosed in EP-A 522,616 wich therefor is incorporated herein by reference.

A particularly preferred photoinitiator for use in the present invention is a composition comprising a hexaarylbisimidazole, a tetraalkyldiaminobenzophenone e.g. Michler's ketone and a chain transfer agent (also called a hydrogen donor) e.g. 2-mercaptobenzoxazole as disclosed in EP-A 437,259.

According to the present invention thermal polymerization inhibitors may also be added to the photopolymerizable composition. Examples of inhibitors for use in accordance with the present invention are disclosed in EP-A 522,616 wich therefor is incorporated herein by reference.

According to a preferred mode of the present invention the hydrophobic photopolymerizable composition comprising at least one monomer and at least one polymeric binder comprises as polymeric binder a thermoplastic polymer. Suitable thermoplastic polymers for rise in accordance with the present invention are disclosed e.g. in EP-A 522,616 wich therefor is incorporated herein by reference.

To the hydrophobic photopolymerizable composition there can also be added non-thermoplastic polymeric compounds to give certain desirable characteristics, e.g. to improve adhesion to said base layer used in accordance with the present invention, adhesion to the receptor support on transfer, wear properties, chemical inertness, etc. Suitable non-thermoplastic polymeric compounds include cellulose, phenolic resins and melamine-formaldehyde resins, etc. If desired, the photopolymerizable compositions can also contain immiscible polymeric or non-polymeric organic or inorganic fillers or reinforcing agents which are essentially transparent at the wave-lengths used for the exposure of the photopolymeric material, e.g. the organophilic silicas, bentonites, silica, powdered glass, colloidal carbon, as well as various types of dyes and pigments in amounts varying with the desired properties of the photopolymerizable composition. The fillers are useful in improving the strength of the composition, reducing tack and in addition, as coloring agents.

Agents to improve the wetting and/or adjust the adhesion of the photopolymerizable composition may be added. Suitable agents are e.g. silicons, silicon containing polymers e.g. a poly (dimethylsiloxane)-polyether copolymer, poly (dimethylsiloxane)-polyester, silicon containing surfactants, fluor containing copolymers and fluor containing surfactants etc.

The non-proteinic water-soluble film-forming polymer comprised in the water-swellable barrier layer being capable of being peeled off of said hydrophilic base by dry development in accordance with the present invention are e.g. homopolymers and copolymers of vinyl alcohol, acrylamide, methylol acrylamide, methylol methacrylamide, salts of acrylic acid and methacrylic acid, hydroxyethyl acrylate, hydroxyethyl methacrylate and maleic anhydride/ vinylmethylether copolymers, polyvinyl pyrrolidone, polyethylene oxide, partly hydrolyzed polyvinyl acetate, salts of sulphonated polystyrene, hydroxyethyl cellulose, carboxymethyl cellulose, salts of cellulose acetate hydrogen phthalate, dextran, dextrins or derivatives thereof, starch, gum arabic, and alginic acid derivatives such as salts or esters thereof. It is also possible to use mixtures of two or more different non-proteinic hydrophilic film-forming polymers. The hydrophilicity of the homopolymer or copolymer used is preferably the same as or higher than the hydrophilicity of polyvinyl acetate hydrolyzed to at least an extent of 60 percent by weight, more preferably 80 percent by weight.

Said water-swellable barrier layer in accordance with the present invention is contiguous to the hydrophilic base according to the present invention, preferably said water-swellable barrier layer is also contiguous to the hydrophobic photopolymerizable composition according to the present invention.

Said water-swellable barrier layer in accordance with the present invention is coated at a ratio of 0.01 to 2.0 g/m$^2$, preferably at a ratio of 0.4 to 1.5 g/m$^2$.

In one preferred embodiment, the water-swellable barrier layer in accordance with the present invention consist of one or more of the above mentioned non-proteinic water-soluble film-forming polymers.

In another preferred embodiment, said water-swellable barrier layer comprises also hydrophobic polymer beads having an average diameter not lower than 0.2 μm and having been prepared by polymerization of at least one ethylenically unsaturated monomer e.g. chosen from the group consisting of alkyl methacrylates e.g. methyl methacrylate, ethyl methacrylate, propyl methacrylate, butyl methacrylate and the higher methacrylates such as stearyl methacrylate, substituted alkyl methacrylates e.g. hydroxyethyl methacrylate, alkyl acrylates, substituted alkyl acrylates, styrene, substituted styrene e.g. chlorostyrene, vinyltoluene and substituted vinyltoluene e.g. vinylbenzyl chloride and the homologues thereof, butadiene, substituted butadiene e.g. chlorobutadiene, 2-methylbutadiene, isobutylene, and substituted isobutylene, and vinylpyridine e.g. 2- and 4-vinyl-pyridine. Preferably, said water-swellable barrier layer-in dry condition comprises said hydrophobic polymer beads in an amount of less than 80% of its total weight.

Said hydrophobic polymer beads can be loaded with various compounds e.g. multifunctional monomers or polymers, initiators, sensitizers etc. as an interesting way of including said compounds in the imaging element.

Said water-swellable barrier layer may comprises an antihalation dye or pigment.

An imaging element according to the present invention may comprise on top of the hydrophobic photopolymerizable composition a thermo-adhesive or a pressure-adhesive transfer layer.

Suitable thermo-adhesive layers (TALs) for use in the present invention have a glas transition temperature $T_g$ between 20° C. and 100° C., preferably below 60° C. as measured with the 1090

The adherance of the TAL to the receptor element is also determined by the flow properties of the TAL while heating above the $T_g$. A parameter for describing this property is the melt viscosity. A TAL suitable for use in accordance with the present invention has a melt viscosity of more than 3000 Poise measured at 120° C. with the VISCOELASTICMELT TESTER of Rheometrics Co, Surrey, UK.

Most preferably a TAL is used with a $T_g$ value between 20° C. and 45° C., a melt viscosity greater than 7000 Poise and an elasticity corresponding to a tg $\delta^{-1}$ value greater than 1.30 measured at 120° C. with the VISCOELASTICMELT TESTER of Rheometrics Co, Surrey, UK. The tg $\delta^{-1}$ value is a measure for the elasticity as described in "Polymer Chemistry: the Basic Concept" by P. C. Hiemenz, 1984, edit. by M. Dekker Inc., New York.

The TAL is preferably coated from an aqueous dispersion of one or more latices. Preferred latices are styrene-butadiene latices and n.-butylacrylate-methylmethacrylate-acrylonitrile latices. These latices can contain other comonomers which improve the stability of the latex, such as acrylic acid, methacrylic acid and acrylamide.

Particularly suitable polymers for use in the TAL layer are the BAYSTAL polymer types, marketed by Bayer AG, Germany, which are on the basis of styrene-butadiene copolymers with a weight ratio between 40/60 and 80/20 and the EUDERM polymers, also from Bayer AG, which are copolymers comprising n.-butylacrylate, methylmethacrylate and acrylonitrile.

Various additives can be present in the TAL to improve the layer formation or the layer properties, e.g. thickening agents, surfactants, levelling agents, thermal solvents and pigments.

Apart from the thermo-adhesive layer the material can contain one or more supplementary thermo-adhesive layer (s) positioned between the upper TAL and the hydrophobic photopolymerizable composition e.g. to optimize the adherance to the hydrophobic photopolymerizable composition in view of obtaining a better image quality after the delamination process. This (these) other TAL(s) can have a composition and/or physical properties different from those imposed to the upper TAL.

As referred to hereinbefore the imaging element according to the present invention may comprise on top of the hydrophobic photopolymerizable composition a pressure-adhesive transfer layer.

Suitable pressure-adhesive layers (PAL's) for use in the present invention comprise one or more pressure sensitive adhesives. Said pressure sensitive adhesives are preferably tacky elastomers. Particularly preferred are natural rubbers and acrylate copolymers as disclosed in U.S. Pat. No. 3,857,731. The used pressure sensitive adhesive preferably has a continuous-coat (100% coverage) peel adhesion value, when applied to untreated paper, between 1 and 10 N/cm width, more preferably between 2 and 7 N/cm width.

According to the present invention the pressure-adhesive layer comprising a pressure sensitive adhesive may contain a binder. Preferably the amount of binder is lower than 2.5 parts by weight with respect to the pressure sensitive adhesives and more preferably lower than 0.6.

According to the present invention the imaging element containing a pressure-adhesive layer preferably comprises a receptor element on top of said pressure-adhesive layer. Preferably said receptor element is(are) (a) transparent layer (s) contiguous to said pressure-adhesive layer e.g. a transparent organic resin layer.

The thickness of the thermo-adhesive or pressure-adhesive transfer layer is important for the adherence during the lamination/delamination process. Preferably the thickness of said transfer layer lies between 0.2 and 30 µm, more preferably between 1 and 15 µm.

A receptor element according to the invention comprises at least one receptor layer which is capable of adhering to the upperlying non-receptor layer of the imaging element. Said receptor element is preferably stable at the processing conditions. The particular receptor element used is dependant on the nature of the composition of the imaging element.

In one embodiment, said receptor element comprises as the receptor layer paper or a poly-Alpha-olefin coated paper. In a preferred embodiment, said receptor layer is a commercially available paper brand as disclosed in PCT/EP 94/02063, which therefor is incorporated herein by reference or a polyethylene coated paper.

In another preferred embodiment, said receptor element comprises as the receptor layer a thermo- or pressure-adhesive layer applied on a flexible support and adhering to said support.

Suitable flexible supports are paper; cardboard; metal foils and meshes e.g. aluminium, copper, steel, bronze etc.; transparent organic resin films e.g. of cellulose esters such as cellulose acetate, cellulose propionate and cellulose butyrate, polyvinyl acetals, polystyrene, polycarbonate or polyvinylchloride; opaque foamed or pigmented polyester; silk; cotton and viscose rayon fabrics or screens. Said receptor element may further comprise a thin additional layer. Examples of such receptor elements are supports provided with a thin metal layer e.g. polyester supports provided with a vapour deposited metal layer. Said receptor element may also comprise (a) additional layer(s) such as (a) backing layer(s) described hereinbefore.

Suitable thermo- or pressure-adhesive layer are described herein before.

The imaging element may be prepared by coating the layers on each other or by laminating layers or packets of layers to each other.

In a practical embodiment the imaging element is prepared by the following steps:
coating on a hydrophilic base in accordance with the present invention (i) a water swellable barrier layer comprising a non-proteinic water-soluble film-forming polymer and optionally hydrophobic polymer beads having an average diameter not lower than 0.2 µm and having been prepared by polymerization of a ethylenically unsaturated monomer (ii) a hydrophobic photopolymerizable composition and (iii) optionally a thermo-adhesive transfer layer.

In another practical embodiment the imaging element is prepared by laminating the above described imaging element with its photopolymerizable composition or optional thermo-adhesive transfer layer onto a receptor layer.

In still another practical embodiment the imaging element is prepared by laminating the above described imaging element with its photopolymerizable composition onto a pressure-adhesive transfer layer being (part of) a receptor element.

In still another practical embodiment the imaging element is prepared by the steps of:
coating on a support or on a thermo-adhesive or a pressure-adhesive transfer layer applied on said support a hydrophobic photopolymerizable composition,
coating on a hydrophilic base in accordance with the present invention a water swellable barrier layer comprising a non-proteinic water-soluble film-forming polymer,
pressing the thus formed photosensitive layer packet with its side carrying said hydrophobic photopolymerizable composition against the barrier layer of said hydrophilic base while heating in order to laminate said layers onto each other.

This latter support can be a transparent receptor element, e.g. an organic resin support or a temporary base, preferably a cellulose triacetate or polyethylene terephtalate film base having been coated with a hydrophilic release layer e.g. polyvinyl alcohol. Said temporary base can be removed before or after the photo-exposure step but before the processing steps.

According to the method of the present invention for obtaining a lithographic printing plate an imaging element according to the present invention is image-wise or information wise exposed to actinic radiation to harden the photopolymerizable composition pattern-wise. The exposure can be a contact exposure using e.g. ultraviolet radiation, a camera exposure, a scanning exposure, or a laser exposure. The radiation source used in carrying out the exposure step includes e.g. sunlight, incandescent lamps, mercury vapour lamps, halogen lamps, xenon lamps, fluorescent lamps, light-emitting diodes, lasers, electron rays, and X-rays.

Said exposure can be made through the front side or the back side of the imaging element. It goes without saying that for an exposure through the back the support has to be transparent for the radiation used for the exposure of the photoposensitive imaging element where for a front side exposure any protective layer, if presents has to be transparent for said radiation. Preferably the imaging element is exposed through the front side.

Subsequent to the image-wise or information-wise exposure an image is obtained by (i) laminating said imaging element with its upper non-receptor layer to a receptor layer of a receptor element before or after said exposure and (ii) peeling away the receptor element from the hydrophilic base thus transferring said hydrophobic photopolymerizable composition patternwise and the optional upperlying layer (s) to the receptor element and uncovering the image comprised of the hydrophilic base and the retained hydrophobic photopolymerizable composition.

When the imaging element does not comprise a pressure-adhesive layer said laminating is effected by means of a heating step, preferably at a temperature between 40° C. and 180° C., more preferably at a temperature between 65° C. and 120° C. Said heating may be applied to either or both the imaging element and the receptor element before, while or after bringing the receptor layer in contact with the upper non-receptor layer of the imaging element. As receptor element different kinds of cheap plain paper can be applied. A broad range of commercial papers with diverging physical properties can be used.

When the imaging element comprises a pressure-adhesive layer, said laminating requires a pressure step. Said pressure is applied while the receptor layer is in contact with the upper non-receptor layer of the imaging element.

An imaging element and a receptor element may be brought in contact before exposure. In such embodiment it is required that either the back of the imaging element and/or preferably the receptor element is transparant for the radiation used for the exposure of the photopolymerizable composition.

An overall exposure, before or after the image-wise exposure can be applied to the imaging element according to the present invention, resulting in a higher sensitivity.

It may be advantageous to overall expose the lithographic printing plate to light and/or heat to enhance its stability. Such a procedure is especially preferred when the imaging element according to the present invention is positive working or to improve the scratch resistance of the lithographic printing plate.

Said lithographic printing plate can further be cleaned with water or an aqueous solution e.g. by wipping with a wet sponge, rinsing with a spray of unheated water or of an aqueous solution etc.

Because the imaging element according to the present intention comprises a hydrophobic photopolymerizable composition on a hydrophilic base, the obtained image can be used as a lithographic printing plate. Pattern-wise transfer of the photopolymerizable composition to a receptor material will then result in an image-wise differentiation between hydrophilic and hydrophobic parts that can be used to print with an oily or greasy ink. The hydrophobic parts will be capable of accepting lithographic ink, whereas the hydrophilic areas, when moistened with water, will not accept the ink. The areas which accept ink form the printing image areas and the ink-rejecting areas form the background areas.

The imaging element can be either positive working or negative working depending i.d. on the weight ratio in the hydrophobic photopolymerizable composition between monomer and (thermoplastic) polymer. For a negative working system said ratio is in general less than 1. For a positive working system said ratio is in general more than 2.

In a negative working imaging element according to the present invention the information-wise exposure to actinic radiation hardens the photopolymerizable composition pattern-wise in correspondence to the information-wise distribution of actinic radiation. Subsequent to the information-wise exposure the image is obtained by (i) laminating said imaging element with its upper non-receptor layer to a receptor element before or after said exposure and (ii) peeling away the receptor element from the hydrophilic base, thereby transferring the non-hardened or insufficiently hardened parts of the hydrophobic photopolymerizable composition and the optional upperlying layer(s) to the receptor element and uncovering the image comprised of the hydrophilic base and the retained hardened parts of the hydrophobic photopolymerizable composition together with the underlying parts of the barrier layer.

In a positive working imaging element according to the present invention the information-wise-exposure to actinic radiation hardens the photopolymerizable composition pattern-wise in correspondence to the information-wise distribution of actinic radiation. Subsequent to the information-wise exposure the image is obtained by (i) laminating said imaging element with its upper non-receptor layer to a receptor element before or after said exposure and (ii) peeling away the receptor element from the hydrophilic base, thereby transferring the hardened parts of the hydrophobic photopolymerizable composition and the optional upperlying layer(s) to the receptor element and uncovering the image comprised of the hydrophilic base and the retained unhardened parts of the hydrophobic photopolymerizable composition together with the underlying parts of the barrier layer.

The following example illustrates the present invention without limiting it thereto. All percentages are by weight unless stated otherwise.

EXAMPLE 1

(Comparative Example)

Preparation of the Imaging Elements

A comparative imaging element I was prepared by the steps of:

coating on a temporary base of polyethylene terephtalate film, having been coated with polyvinyl alcohol in a dry thickness of 1 μm, to a wet coating thickness of 40 μm by means of a knife coater a hydrophobic photosensitive composition A consisting of a solution in methylethyl ketone of 3.5% by weight of compound 1 of table I, 4.8% by weight of polyvinyl acetate, 0.2% by weight of a blue dye (C.I. 61551), 1.3% by weight of bis-imidazole, 0.12% by weight of Michler's ketone, and 0.07% by weight of mercaptobenzoxazole and drying said coating for 5 minutes at 40° C., pressing the thus formed photosensitive layer packet with its side carrying said hydrophobic photopolymerizable composition against electro-chemical grained, anodized and sealed Al support of 0.15 mm thicknes and a CLA value of 0.7 μm and conveying the contacting elements through a roll laminator device at 85° C. and a speed of 0.7 m/min and peeling away said temporary support from the photopolymerizable composition.

Imaging elements II to VII according to the present invention were prepared similar to the comparitive imaging element except that said Al support was coated by means of a knife coater with a barrier layer, which was applied from water and dried for 5 minutes at 40° C. before pressing such Al support with its side carrying the barrier layer against the hydrophobic photopolymerizable composition of said photosensitive layer packet. Imaging element VIII according to the present invention was prepared similar to the imaging element V except that a hydrophobic photosensitive composition B is used consisting of a solution in methylethyl ketone of 3.7% by weight of dipentaerythritol pentaacrylate, 5% by weight of a copolymer of styrene/butylacrylate, 0.2%-by weight of a blue dye (C.I. 61551), 1.3% by weight of bis-imidazole, 012% by weight of Michler's ketone, and 0.07% by weight of mercaptobenzoxazole. The composition of the applied barrier layers and of the imaging elements I to VIII are given in table II.

TABLE II

| Imaging element | Photosen. compos. | Barrier layer | | | |
|---|---|---|---|---|---|
| | | Pol 1[1) | POL 2[2) | POL 3[3) | PMMA[4) |
| I | A | 0 | 0 | 0 | 0 |
| II | A | 0.44 g/m² | 0 | 0 | 0.50 g/m² |
| III | A | 0.44 g/m² | 0 | 0 | 0 |
| IV | A | 0 | 0.44 g/m² | 0 | 0.50 g/m² |
| V | A | 0 | 0.44 g/m² | 0 | 0 |
| VI | A | 0 | 0 | 0.44 g/m² | 0.50 g/m² |
| VII | A | 0 | 0 | 0.44 g/m² | 0 |
| VIII | B | 0 | 0.44 g/m² | 0 | 0 |

[1)Pol 1: Hydroxymethylcellulose.
[2)POL 2: Polyacrylamide.
[3)POL 3: Copolymer of vinylalcohol/vinylacetate.
[4)PMMA: Polymethyl methacrylate beads having an average particle size of 1 μm.

On top of the imaging elements I-VIII described above there was placed a test target with a 60 lines per cm screen as well as fine positive and negative lines, and the imaging elements were exposed therethrough to ultraviolet radiation.

Each of the exposed imaging elements was then placed in face-to-face contact with a paper receptor element (Ideal Blanc Brillant—170 g/m², marketed by Papeterie Belge, S. A., Belgium).

The contacting elements were conveyed through a roll laminator device at 110° C. and a speed of 0.35 m/min. Next, the elements were peeled apart whereby the non-exposed parts of the photopolymerizable composition are removed and the exposed areas remain on the Al support thus resulting in a negative working lithographic printing plate.

All imaging elements showed the same sensitivity.

In one embodiment, said lithographic printing plates were supplementary cleaned with water by wipping with a wet sponge. In another embodiment, said lithographic printing plates were used as such.

The lithographic printing plates obtained by both embodiments could he used to print on a conventional offset press using a commonly employed ink and fountain. The obtained lithographic results as measured on the 100$^{th}$ copy are summarized in table III.

TABLE III

| Imaging element | Lithogra. plate Line rep[1 | density of 100$^{th}$ copy | | | |
|---|---|---|---|---|---|
| | | plate as such | | sponged plate | |
| | | Dmax | Dmin | Dmax | Dmin |
| I(comp) | — | 1.39 | 1.36 | 1.36 | 1.34 |
| II(inv) | 30 | — | — | 1.16 | 0.04 |
| III(inv) | 55 | 1.76 | 0.05 | 1.42 | 0.00 |
| IV(inv) | 40 | 1.62 | 0.01 | 1.31 | 0.02 |
| V(inv) | 55 | 1.70 | 0.01 | 1.59 | 0.00 |
| VI(inv) | 55 | — | — | 1.18 | 0.04 |
| VII(inv) | 55 | — | — | 1.42 | 0.01 |
| VIII(inv) | 70 | 1.18 | 0.01 | 1.36 | 0.00 |

[1Line reproduction: the smallest line (in μm) which can correctly be reproduced.

As can be seen from table IIIa lithographic plate obtained from an imaging element without a barrier layer can not be used for printing due to a complete staining. Good copies substantially free of staining were produced by the lithographic plates obtained from the imaging elements with a water swellable barrier layer located between the hydrophilic Al support and the hydrophobic photopolymerizable composition in accordance with the present invention. The presence of polymethyl methacrylate beads having an average particle size of 1 μm can even improve this already low staining when a further cleaning of the lithographic plate is effected by wipping with a wet sponge.

We claim:

1. An imaging element comprising on a hydrophilic base a hydrophobic photopolymerizable composition comprising at least one monomer containing at least one ethylenically unsaturated group and at least one polymeric binder and a water-swellable barrier layer located between said hydrophilic base and said hydrophobic photopolymerizable composition, contiguous to the hydrophilic base comprising at least one non-proteinic water-soluble film-forming polymer and coated at a ratio of 0.01 to 2.0 g/m², said water-swellable barrier layer being capable of being peeled off of said hydrophilic base by dry development wherein said water-swellable barrier layer comprises hydrophobic polymer beads having an average diameter not lower than 0.2 μm and having been prepared by polymerization of at least one ethylenically unsaturated monomer.

2. An imaging element according to claim 1 wherein said hydrophilic base is a grained, anodized, and sealed aluminum support.

3. An imaging element according to claim 1 wherein said water-swellable barrier layer is coated at a ratio of 0.4 to 1.5 g/m².

4. An imaging element according to claim 1 comprising on top of said hydrophobic photopolymerizable composition a pressure-adhesive layer with a continuous-coat (100% coverage) peel adhesion value, when applied to untreated paper between 1 and 10 N/cm width.

5. An imaging element according to claim 1 comprising on top of said hydrophobic photopolymerizable composition a thermo-adhesive layer having a glass transition temperature $T_g$ value between 20° C. and 45° C., a melt viscosity greater than 7000 Poise and an elasticity corresponding to a $t_g \, \delta^{-1}$ value greater than 1.30 measured at 120° C.

* * * * *